(12) United States Patent
Ueno et al.

(10) Patent No.: US 9,431,454 B1
(45) Date of Patent: Aug. 30, 2016

(54) IMAGING APPARATUS

(71) Applicant: KABUSHIKI KAISHA TOSHIBA, Tokyo (JP)

(72) Inventors: Risako Ueno, Tokyo (JP); Koichi Ishii, Kanagawa (JP); Kazuhiro Suzuki, Tokyo (JP); Hideyuki Funaki, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/843,499

(22) Filed: Sep. 2, 2015

(30) Foreign Application Priority Data

Feb. 27, 2015 (JP) .................................. 2015-038387

(51) Int. Cl.
*H01L 27/146* (2006.01)

(52) U.S. Cl.
CPC ... *H01L 27/14649* (2013.01); *H01L 27/14621* (2013.01); *H01L 27/14627* (2013.01)

(58) Field of Classification Search
CPC .......... G01J 5/00; G01J 5/0803; G01J 5/024
See application file for complete search history.

(56) References Cited

U.S. PATENT DOCUMENTS

| 2005/0082480 A1* | 4/2005 | Wagner | G01J 5/60 250/338.1 |
|---|---|---|---|
| 2011/0026029 A1 | 2/2011 | Iwasaki et al. | |
| 2014/0132279 A1 | 5/2014 | Honda et al. | |
| 2015/0002843 A1 | 1/2015 | Yokogawa | |

FOREIGN PATENT DOCUMENTS

| JP | 2006-220623 | 8/2006 |
|---|---|---|
| JP | 2010-43885 | 2/2010 |
| JP | 2014-96773 | 5/2014 |
| JP | 2015-12128 | 1/2015 |
| WO | WO-2009/123068 | 10/2009 |

* cited by examiner

*Primary Examiner* — David Porta
*Assistant Examiner* — Faye Boosalis
(74) *Attorney, Agent, or Firm* — Finnegan, Henderson, Fararow, Garrett & Dunner LLP

(57) ABSTRACT

An imaging device includes a light source which irradiates an infrared light including one or more wavelength to a subject; a lens which forms an image of the infrared light transmitting the subject or being reflected from the subject; an infrared detection device including a plurality of pixels which are sensitive to the wavelength; and a filter array which is provided in proximity to the infrared detection device between the lens and the infrared detection device and including a plurality of wavelength filters having different transmission wavelengths.

17 Claims, 16 Drawing Sheets

FIG. 13A
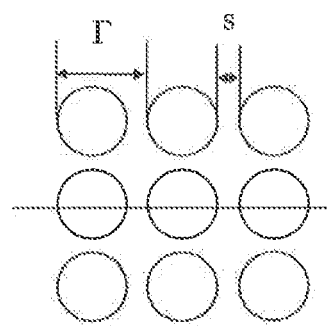
FIG. 13C
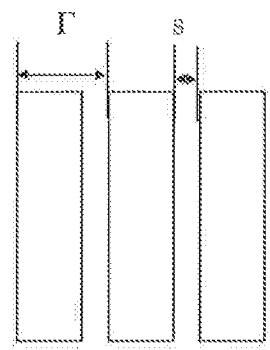
FIG. 13B
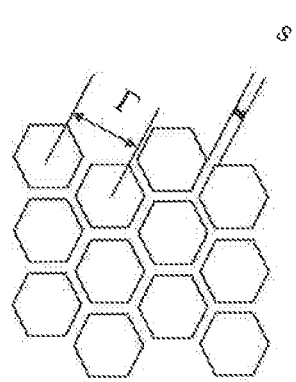
FIG. 13D
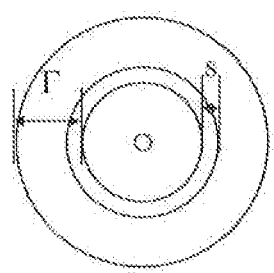
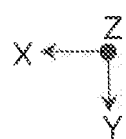

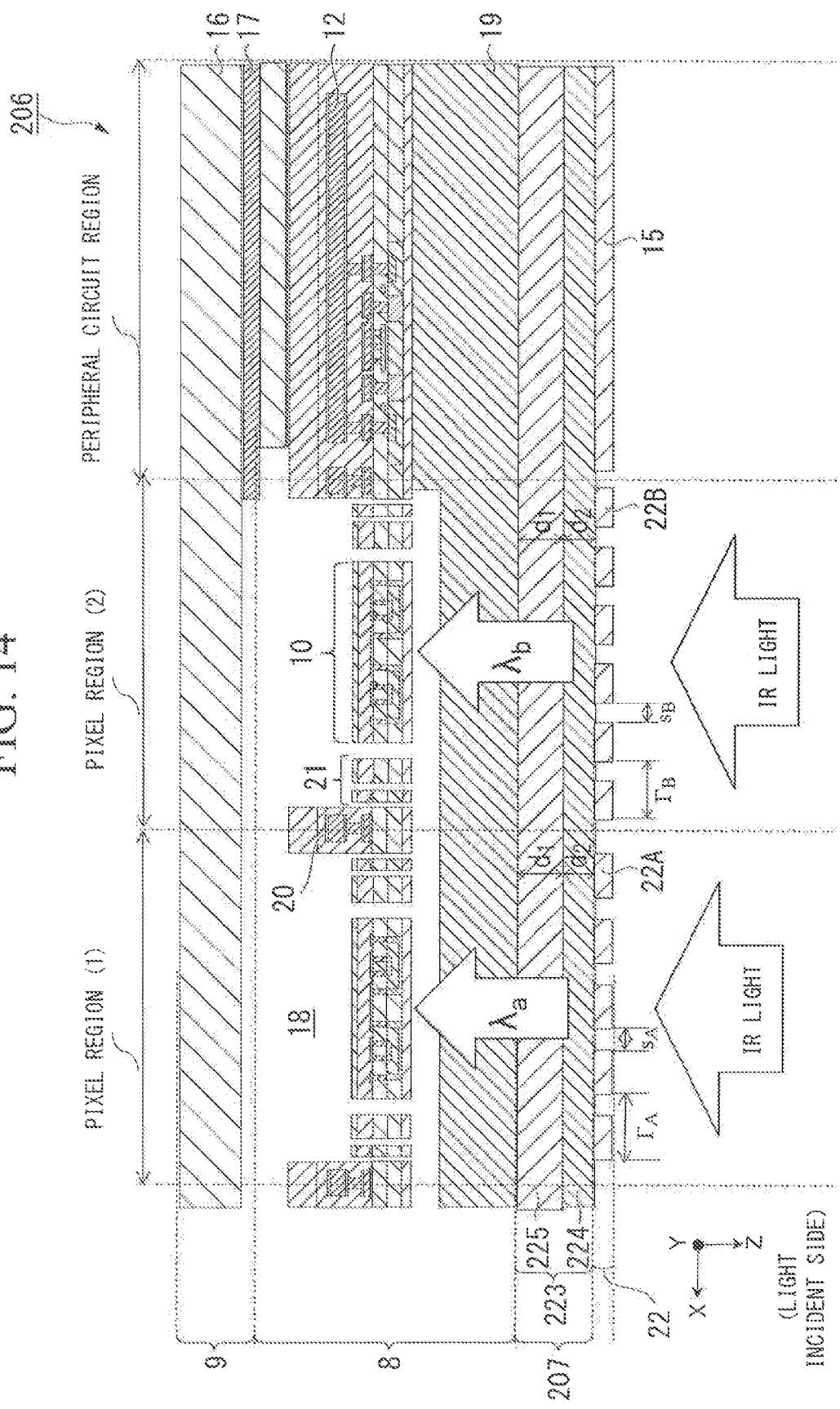

IMAGING APPARATUS

CROSS-REFERENCE TO RELATED APPLICATIONS

This application is based upon and claims the benefit of priority from Japanese Patent Application No. 2015-038387, filed Feb. 27, 2015; the entire contents of which are incorporated herein by reference.

FIELD

Embodiments described herein relate generally to a solid imaging apparatus.

BACKGROUND

Far Infrared (FIR; 8 to 15 µm) region is an electromagnetic wavelength band having a black body radiation intensity peak in the vicinity of the human body temperature. On the other hand, Mid Infrared (MIR; 3 to 5 µm) region, which is on the side of shorter wavelengths relative to the FIR, is an electromagnetic wavelength band having a black body radiation intensity peak at a relatively high temperature of between 200 and 400° C.

In connection with the above-described black body radiation intensity, techniques for detecting electromagnetic waves in the MIR region is used mainly for detecting high temperature objects and for detecting at the fire site, etc. On the other hand, there is a material-specific absorption peak due to rotation and vibration of molecules in the whole MIR and FIR regions. In particular, information on the molecular structure is obtained by obtaining the IR spectrum in the 2 to 20 µm band. More precisely, whether a certain functional group (alcohol, amine, ketone, aliphatic, etc.) is present can be identified; information sets on appearance of absorption in certain wavelengths may be combined to check against a database to perform material identification.

Infrared spectroscopic analysis techniques using the above-described MIR-FIR regions, including the FT-IR analysis technique, are widely used in analysis such as organic chemical analysis. FT-IR apparatuses (spectroscopy: Michelson's interferometer, detector: a cooling-type MCT, etc.), apparatuses which are superior in the precision for wavelength analysis and widely used, are analyzers for obtaining information on simple substance samples and are not for obtaining spatial distribution (camera image information). Moreover, most of the so-called infrared spectrometers (spectroscopy: a filter, etc., detector: a cooling-type MCT, etc.) are also for obtaining the information on the simple substance samples. On the other hand, while attention is focused on infrared spectropic microscopes for obtaining image information and the infrared spectrum of an image point thereof, they are quite expensive.

BRIEF DESCRIPTION OF THE DRAWINGS

FIGS. 13A to 13D are plan views illustrating other exemplary patterns of the resonance layer;

FIG. 14 is an enlarged cross-sectional view illustrating the configuration of the major part of the imaging module according to a second embodiment;

DETAILED DESCRIPTION

According to some embodiments, an imaging device includes a light source; a lens; an infrared detection device; and a filter array. The lens forms an image of an infrared light transmitting a subject or being reflected from the subject. The infrared detection device includes a plurality of pixels which are sensitive to a wavelength. The filter array is provided in proximity to the infrared detection device between the lens and the infrared detection device and includes a plurality of wavelength filters having different transmission wavelengths.

Various embodiments of the imaging device or a solid image apparatus will be described hereinafter with reference to the accompanying drawings.

The drawings used in the description hereinafter may be shown with parts to be characteristic features enlarged for the sake of convenience, so that the dimension ratios of the respective constituting elements are not necessarily the same as the actual ones.

First Embodiment

First, an exemplary configuration of a solid imaging apparatus according to a first embodiment is described.

Figure 1:
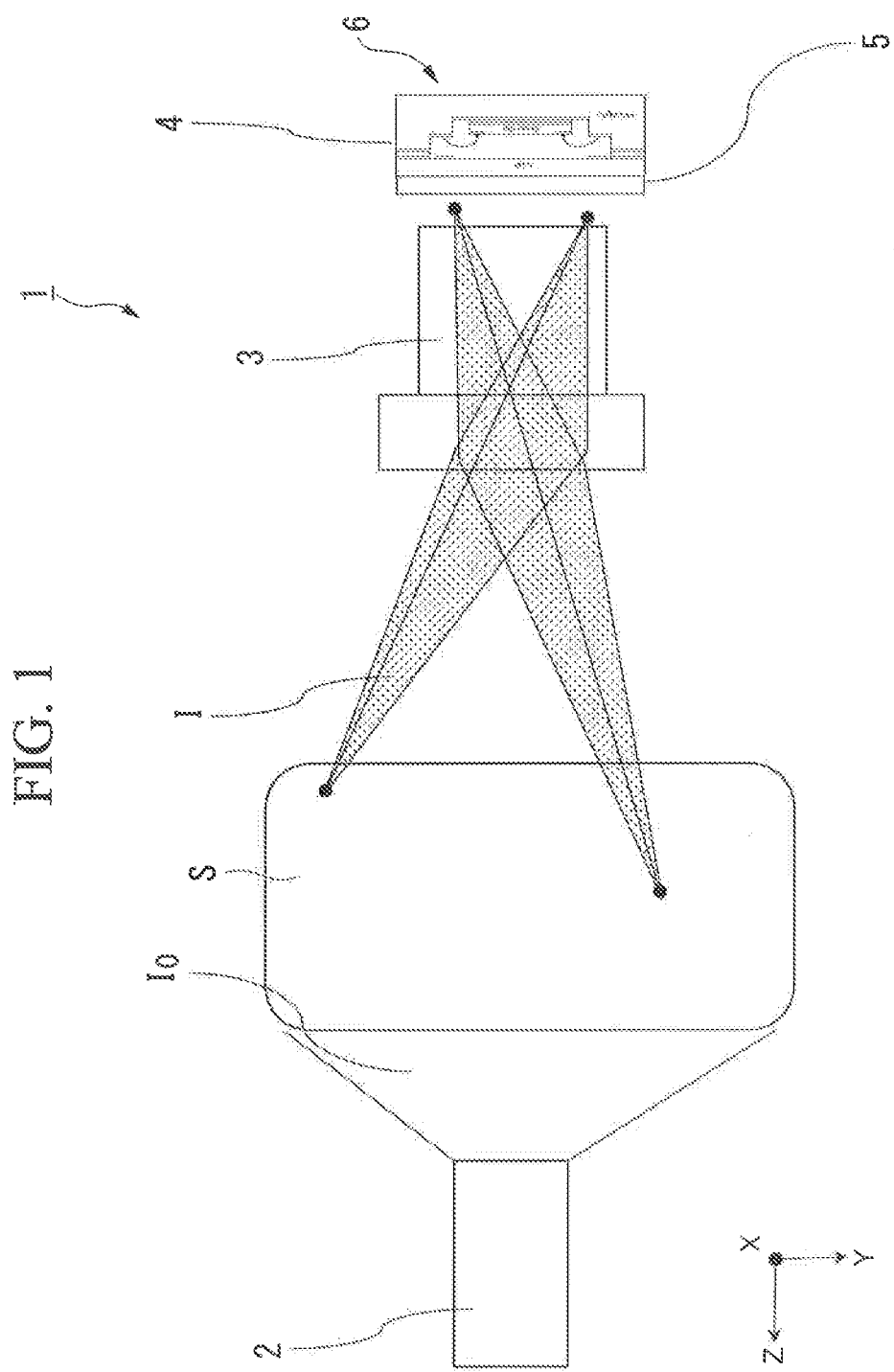
FIG. 1 is a system diagram illustrating a configuration of a solid imaging apparatus according to a first embodiment.

FIG. 1 is a system diagram illustrating a configuration of the solid imaging apparatus according to the first embodiment. As illustrated in FIG. 1, a solid imaging apparatus 1 according to the present embodiment includes a light source 2 which irradiates an infrared light $I_o$ onto a subject (an object to be measured) S; a lens (an image-forming optical member) 3 which forms an image of an infrared light I which transmits the subject S; and an imaging module 6 in which an infrared detection device 4 and a wavelength transmission filter array 5 are integrated. The solid imaging apparatus 1 according to the present embodiment is an active-type infrared hyperspectral imaging apparatus in which material identification of and image information on the subject S is obtained from wavelength information obtained with the imaging module 6 (the infrared detection device 4).

The light source 2 is a thermal type (a non-dispersion type) light source which irradiates the infrared light $I_o$ including wavelength bands ($\lambda_{C1}$, to $\lambda_{C2}$) to be detected onto the subject S. Here, the wavelength bands ($\lambda_{C1}$ to $\lambda_{C2}$) are not limited thereto as long as they include mid-infrared to far-infrared regions (in other words, 2 m to 30 µm). The light source 2 as described above includes an incandescent filament, a filament-type infrared light source, a ceramic high-luminance light source, a halogen lamp, a high-pressure mercury light source, for example.

The lens 3 is an image-forming optical member which functions as an optical imaging system which takes the infrared light I from the subject (the object to be measured) into the infrared detection device 4. The lens 3 is not limited thereto as long as it may project the intensity of light collected at the respective spatial locations (X, Y, Z) as an image.

In the imaging module 6, the infrared detection device 4 and the wavelength transmission filter array 5 are laminated to be integrated. The imaging module 6 functions as a device which converts the intensity of the infrared light I collected by the lens (image-forming member) 3 to a voltage of a signal and outputs the signal.

The infrared detection device 4 is a two-dimensional infrared detection sensor in which multiple pixels are arranged in a two-dimensional array on an X-Y plane to obtain image information. For the multiple pixels, micro bolometers, etc., are used as thermoelectric conversion device, for example.

Figure 2:
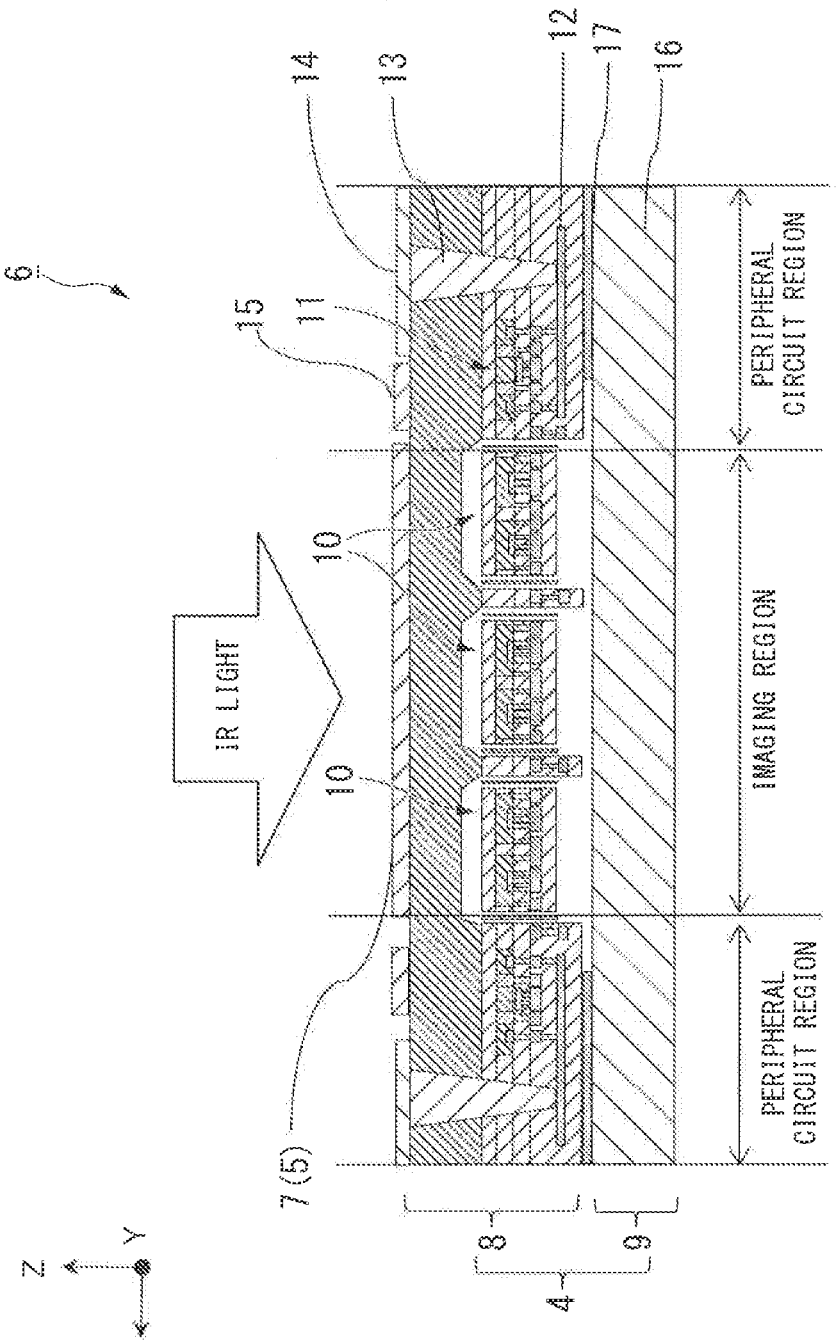
FIG. 2 is a cross-sectional view illustrating an imaging module which makes up the solid imaging apparatus according to the first embodiment.

FIG. 2 is a cross-sectional view illustrating the imaging module 6 which makes up the solid imaging apparatus 1 according to the present embodiment. As illustrated in FIG. 2, the imaging module 6 is generally configured such that a wavelength transmission filter array layer 7, an infrared detection device layer 8, and a support layer 9 that are included therein are laminated. Moreover, the imaging module 6 includes multiple regions including an imaging region and peripheral circuit regions.

The wavelength transmission filter array layer 7 includes the wavelength transmission filter array 5, which is provided in the imaging region.

In the imaging region of the infrared detection device layer 8, there is provided a non-cooling type infrared detector (an optical detector) 10 which includes an array of micro bolometers, for example. Here, the micro bolometer converts incident infrared light to heat with an infrared absorber and then converts, by a thermoelectric converter, a temperature change in a thermal sensor that is caused due to the weak heat to an electrical signal and read the electrical signal to obtain infrared image information. Depending on the material of the above-described infrared absorber, infrared light of a wide wavelength bandwidth (for example, 3 µm to 30 µm) may be absorbed, allowing a configuration which is sensitive in a wavelength bandwidth which is higher than that for a compound-type solid imaging device such as MCT (mercury cadmium telluride; HgCdTe) in which a sensitivity wavelength is determined by a material-specific band gap.

On the other hand, the peripheral circuit regions of the infrared detection device layer 8 includes a read circuit 11; a wiring layer 12; a through electrode 13 which is an electrode to the exterior; an electrode pad 14; a light shielding layer 15 including a light-shielding metal film which prevents unnecessary light from penetrating, etc.

The support layer 9, which includes a support substrate 16, is bonded with the infrared detection device layer 8 via a support substrate bonding section 17. In other words, the infrared detection device layer 8 and the support layer 9 are laminated to form the infrared detection device 4.

Now, in the infrared detection device layer 8, it is necessary to thermally separate, from the surroundings, the optical detector 10 (including the infrared absorption structure and the thermoelectric converter) which converts incident infrared light to heat to convert the heat to an electrical signal to improve the thermoelectric conversion efficiency. Then, the infrared detection device layer 8 is configured such that a device separating oxide film and a silicon substrate around the optical detector 10 are removed by etching to create a cavity section 18 which is made to be a vacuum to prevent heat from dispersing into the support substrate 16.

In the imaging region is provided valid pixels and reference pixels (not shown). Here, the reference pixels, which refer to an OB (Optical Black), a TB (Thermal Black), etc., are used to refer to black levels (offset levels), respectively. At an upper portion of the optical black pixel is formed a light-shielding metal film. This light-shielding metal film may be formed of the same metal as the below-described metal pattern layer.

On the other hand, in the periphery circuit regions is provided a drive circuit (not shown) which drives the respective pixels of a pixel array of the imaging device; and a pixel signal processing circuit (not shown) which processes a signal output from a pixel region.

The drive circuit includes, for example, a vertical selection circuit which successively selects a pixel to be driven in the vertical direction in horizontal lines (rows); a horizontal selection circuit which successively selects in columns; a TG (Timing Generator) circuit which drives them with various pulses.

The above-described pixel signal processing circuit includes an AD conversion circuit which digitally converts an analog electric signal from the pixel region; a gain adjustment/amplification circuit which performs gain adjustment and amplification operation, a digital signal processing circuit which performs a process for correcting the digital signal.

Figure 3:
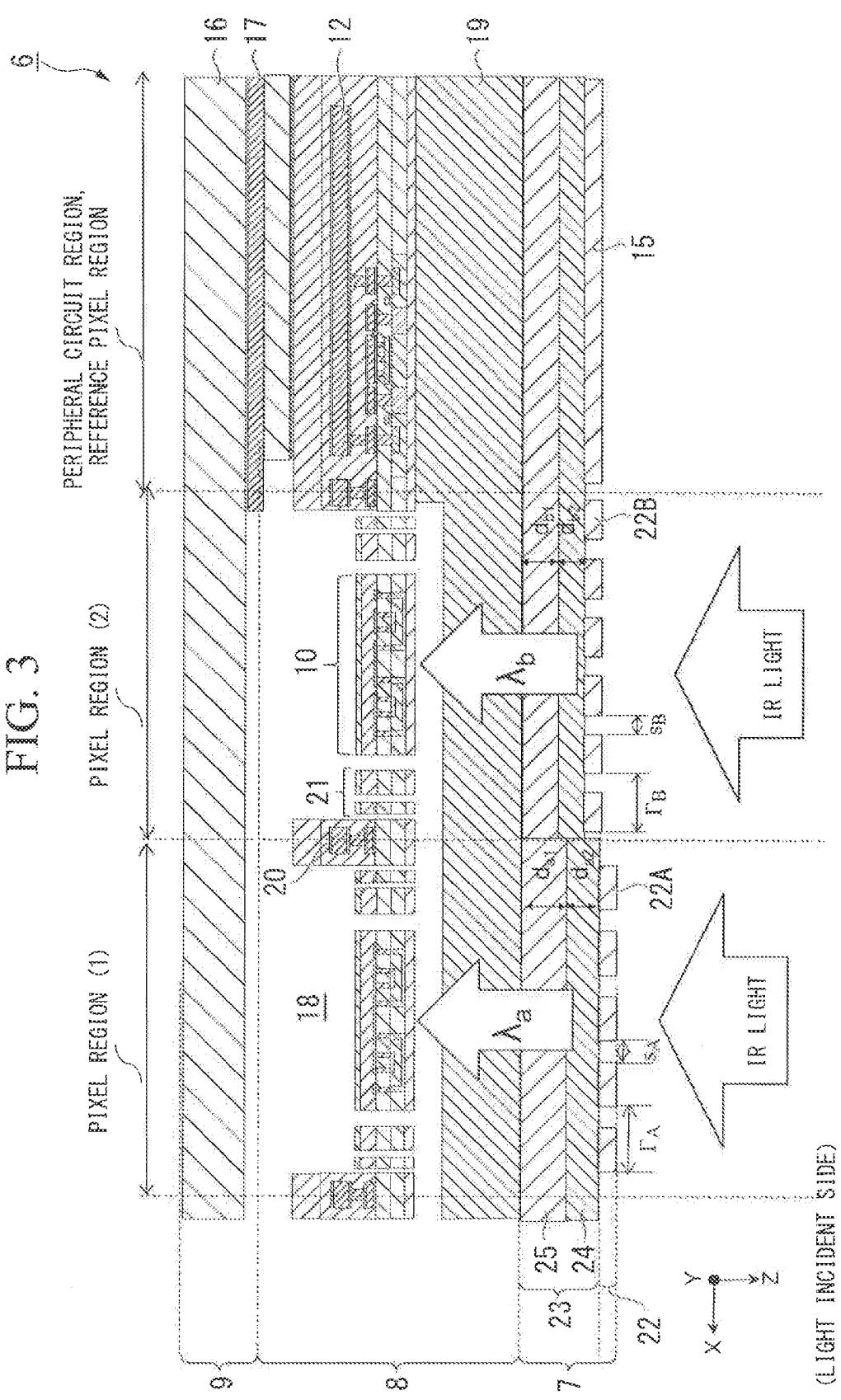
FIG. 3 is an enlarged cross-sectional view illustrating a configuration of a major part of the imaging module according to the first embodiment.

FIG. 3 is an enlarged cross-sectional view (X-Z plane view) illustrating an exemplary configuration of a major part of the imaging module 6. As illustrated in FIG. 3, the infrared detection device layer 8 includes a semiconductor substrate 19 on which surface is provided the cavity section 18, which is a vacuum; a wiring 20 which is formed in a region surrounding the cavity section 18 of the semiconductor substrate 19; a support leg 21 which is connected to the wiring 20 and which is arranged on the cavity section 18 of the semiconductor substrate 19 inside the wiring 20; and the optical detector 10, which is connected to the support leg 21 to be supported on the cavity section 18 of the semiconductor substrate 19 inside the support leg 21.

The wavelength transmission filter array layer 7 is laminated on the side of the semiconductor substrate 19 which makes up the infrared detection device layer 8. Moreover, the wavelength transmission filter array layer 7, which includes a resonance layer 22 and an interference layer 23, is configured such that the resonance layer 22 and the interference layer 23 are laminated in the order of the resonance layer 22, followed by the interference layer 23, when viewed from the side of the light-incident direction, or, in other words, the positive direction of the Z-axis shown in FIG. 3.

The resonance layer 22 includes metal pattern layers 22A and 22B of the periodic structure that are formed of metal thin films; and the light shielding layer 15. While the material (in other words, metal) of the metal thin film is not specifically limited, aluminum (Al), silver (Ag), gold (Au), tungsten (W), copper (Cu), and alloys thereof may be used, for example.

The metal pattern layers 22A and 22B and the light shielding layer 15 may be formed of the same metal thin film, or may be formed of different metal thin films.

Figure 4:
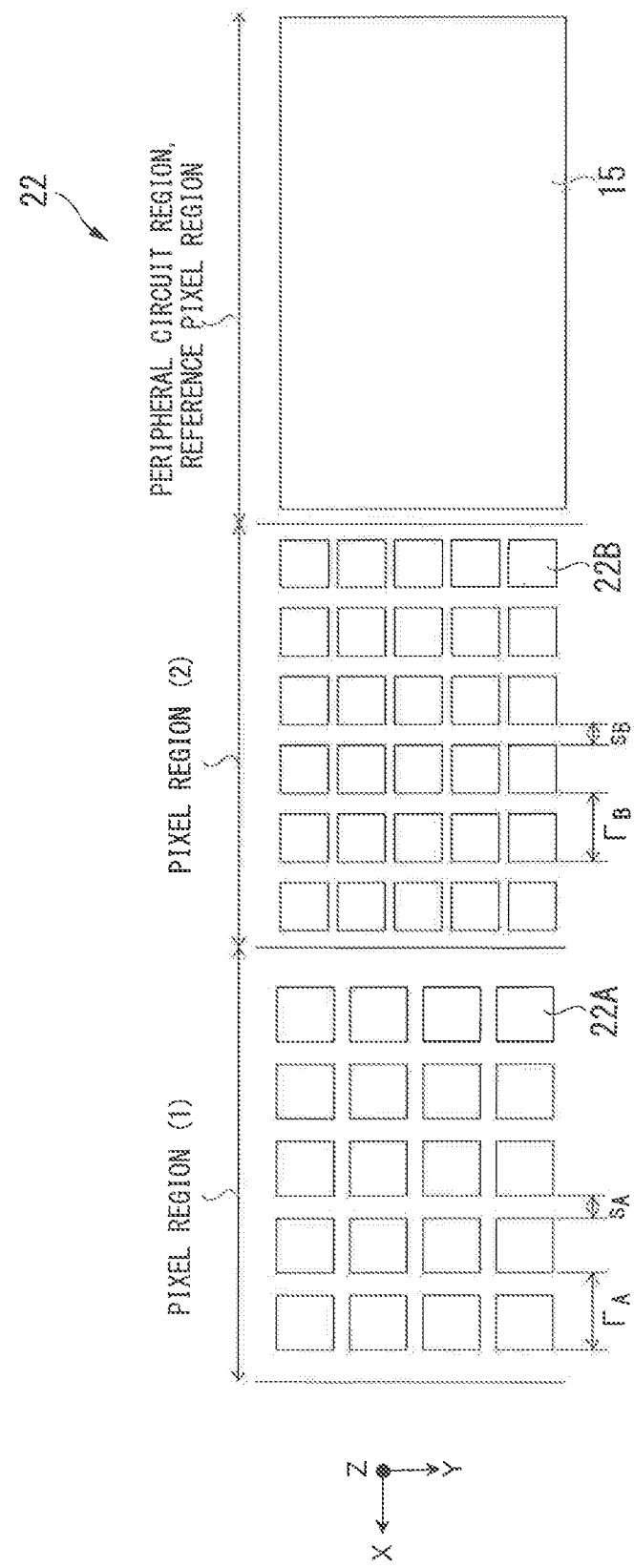
FIG. 4 is a plan view illustrating a pattern of a resonance layer according to the first embodiment.

FIG. 4 is a plan view (X-Y plane view) illustrating an exemplary pattern of the resonance layer 22. As shown in FIG. 4, the metal pattern layers 22A and 22B are configured such that rectangular (generally square) shaped metal patterns made of a metal thin film are arranged in a two-dimensional array shape with a predetermined pattern period (pitch) and an inter-pattern interval. On the other hand, the whole face of the light shielding layer 15 is covered with a metal pattern.

In a pixel region (1) the metal pattern layer 22A has a pattern period ($\Gamma_A$) and an inter-pattern interval ($s_A$). Moreover, in a pixel region (2) the metal pattern layer 22B has a pattern period ($\Gamma_B$) and an inter-pattern interval ($s_B$).

Now, a pattern period ($\Gamma$) of a metal pattern with the metal pattern layers 22A and 22B as one example is known to determine a Surface Plasmon Polariton (SPP) infrared light resonance wavelength. Then, a light of a wavelength band in which resonance occurs transmits therethrough to function as a wavelength transmission filter.

Here, the above-described SPP refer to the plasmons, which are oscillations of free electrons in metal; and plaritons, in which lights which move within the dielectric couple, are compression waves which passes through the interface. For example, the wave number $k_x$ of the SPP when it passes in the X direction through an interface between the dielectric (permittivity: $\epsilon_d$) and the metal (permittivity: $\epsilon_m$) at Z=0 is shown with the following Equation (1):

$$k_x = \frac{\omega}{c} \sqrt{\frac{(\epsilon_m \times \epsilon_d)}{(\epsilon_m + \epsilon_d)}} \qquad \text{Equation (1)}$$

In the above Equation (1), $\omega$ refers to an angular frequency (1/s), while c refers to velocity of light (m/s).

The above-described SPP is characterized by containment into the boundary face and enhancement of the electric field in the vicinity of the interface. Therefore, in the above-described Equation (1), the relationship of the Equation (2) below needs to be satisfied:

$$\epsilon_d + \epsilon_m < 0 \qquad \text{Equation (2)}$$

The permittivity $\epsilon_m$ of the metal, which varies with $\omega$, is shown with a function $\epsilon_m(\omega)$. It is shown in Equation (3) below using a plasma frequency $\omega_p$:

$$\epsilon_m(\omega) = 1 - \frac{ne^2}{\epsilon_0 m \omega^2} = 1 - \frac{\omega_p^2}{\omega^2} \qquad \text{Equation (3)}$$

Therefore, in accordance with (2) and (3) in the above, to at which the SPP is present is shown with the following Equation (4):

$$\omega < \frac{\omega_P}{\sqrt{1+\epsilon_d}} \qquad \text{Equation (4)}$$

On the other hand, the SPP is a vertical wave, and may not be excited just by irradiating a p-polarized light onto a metal thin film from inside the vacuum, so that the wave number $k_x$ needs to be increased. To increase the wave number for excitation, a grating structure is used; the grating of the wave number $k_g$ (the convexo-concavity of the period ($\Gamma$)) is shown as $k_g = 2\pi/\Gamma$. When the result of adding n times the integer and the incident light wave number ($k_x = 2\pi \sin\theta/\lambda_{in}$) matches the wave number ($k_{SPP} = 2\pi/\lambda_{SPP}$) of the SPP (in other words, when the relationship in Equation (5) below is satisfied), the incident light and the SPP couple to cause the SPP of the resonance wave length $\lambda_{SPP}$ to be excited.

$$k_{SPP} = \frac{2\pi}{\lambda_{in}} \sin\theta + n\frac{2\pi}{\Gamma} \qquad \text{Equation (5)}$$

As described above, for the respective wavelength transmission filters, the pattern period ($\Gamma$) of the metal pattern determines the transmission center wavelength $\lambda_1$. Moreover, the interval (s) between the metal patterns affects the half-value width of the transmission wavelength, the transmittance, etc. The principle of the SPP can be applied not only in the one-dimensional direction, but also in the two-dimensional direction.

As illustrated in FIG. 3, the interference layer 23 includes a sympathetic vibration layer 24 with film thicknesses $d_{a2}$, $d_{b2}$ and a transmission layer 25 with film thicknesses $d_{a1}$, $d_{b1}$. Moreover, the interference layer 23 is configured such that the sympathetic vibration layer 24 and the transmission layer 25 are laminated in the order of the sympathetic vibration layer 24, followed by the transmission layer 25, when viewed from the side of the light-incident direction (the positive direction of the Z-axis shown in FIG. 3).

For the film which makes up the sympathetic vibration layer 24, the material thereof is not limited thereto as long as it has the transmittance of a desired infrared region that is sufficiently high and has high reflectance. Such high-reflectance materials include silicon (Si), germanium (Ge), gallium arsenide (GaAs), for example.

For the film which makes up the transmission layer 25, the material thereof is not limited thereto as long as it has the transmittance of a desired infrared region that is sufficiently high and has low reflectance. Such low-reflectance materials include silicon oxide film ($SiO_2$), zinc selenide (ZnSe), zinc sulfide (ZnS), for example. Moreover, as the low-reflectance material, silicon (Si) may be subjected to a fine concave-convex process to less than or equal to the infrared wavelength and embed the low-reflectance material into a hole thereof to make a low-reflectance material.

The film thickness of the sympathetic vibration layer 24 and the transmission layer 25 that make up the interference layer 23 is designed with the transmission center wavelength $\lambda_i$.

For example, in the sympathetic vibration layer 24, with the reflectance of the material it is formed of being set to $n_{d2}$, it is desirable to set the film thickness $d_2$ such that $d_2=\lambda_i/2n_{d2}$. The film thickness may be set to the one-half wavelength of the optical film thickness to cause sympathetic vibration within the thin film of the sympathetic vibration layer 24, thereby increasing the transmittance.

On the other hand, in the transmission layer 25, to prevent reflection of the wavelength of $\lambda_i$ and increase the transmittance, it is desirable to set the film thickness $d_1=\lambda_i/4n_{d1}$ with the reflectance of the material it is formed of being set to $n_{d1}$.

As shown in FIGS. 3 and 4, the imaging module 6 according to the present embodiment is provided with a filter which causes different transmission wavelengths $\lambda_a$ and $\lambda_b$ to be transmitted for the pixel regions (1) and (2). In other words, the wavelength transmission filter array layer 7 includes multiple filters which transmit respectively different wavelengths; with these filters, the pattern period (Γ) of the metal pattern layers 22A, 22B which make up the resonance layer 22 and the film thicknesses $d_1$ and $d_2$ of the sympathetic vibration layer 24 and the transmission layer 25 that make up the interference layer 23 are adjusted by the transmission center wavelength $\lambda_i$.

Figure 5:
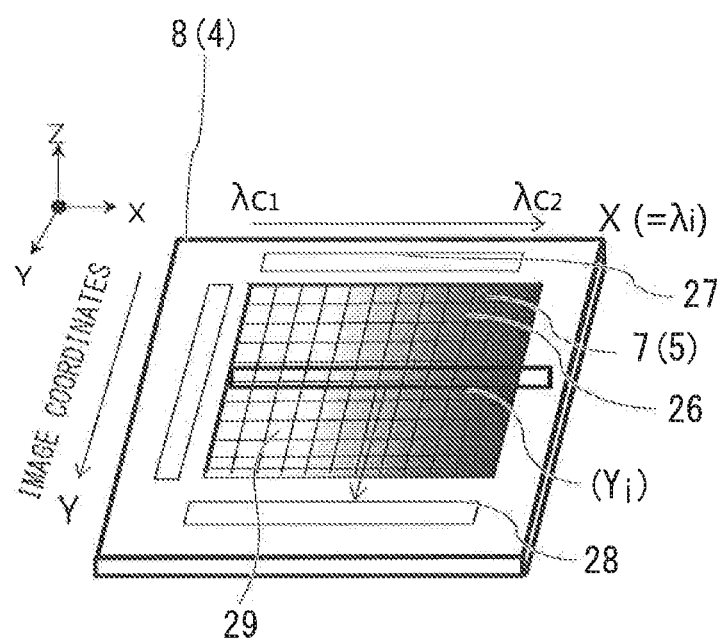
FIG. 5 is a perspective view illustrating the plane structure of an imaging module 6 according to the first embodiment.
Figure 6:
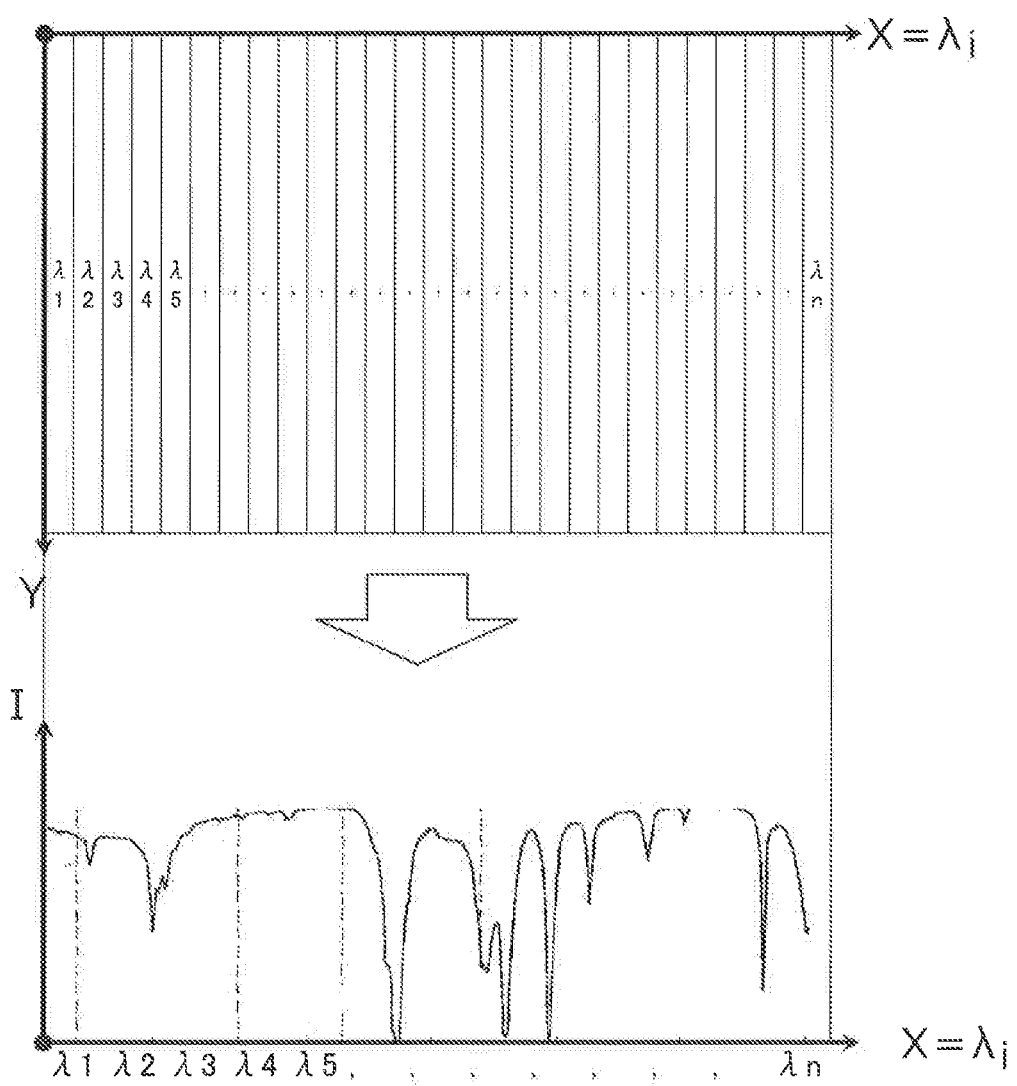
FIG. 6 is a schematic view illustrating the correspondence between a transmission wavelength band ($\lambda_i$) and spectral data.

FIG. 5 is a perspective view illustrating the plane structure of the imaging module 6 which makes up the solid imaging apparatus 1 according to the present embodiment. Moreover, FIG. 6 is a schematic view illustrating the correspondence between a transmission wavelength band ($\lambda_i$) and spectral data.

As shown in FIG. 5, in the imaging module 6, the infrared detection device layer 8 (infrared detection device 4) and the wavelength transmission filter array layer 7 (wavelength transmission filter array 5) are laminated to be integrated. Moreover, in the wavelength transmission filter array 5, multiple wavelength transmission filters with different transmission wavelength bandwidths are arranged on an X-Y plane.

The plane structure of the infrared detection device layer 8 includes an imaging region 26; and a peripheral circuit region 27, which includes a read circuit 28. Moreover, the imaging region 26 is a two-dimensional infrared detector in which infrared light detectors 29 are two-dimensionally arranged.

In the imaging module 6 which makes up the present embodiment, the wavelength transmission filter array 5, which is a filter which transmits the same wavelength band in the Y direction, is a linear variable filter (LVF) whose transmission wavelength gradually changes in the X direction. In other words, in the wavelength transmission filter array 5, wavelength transmission filters whose transmission wavelength bandwidths continuously change are arranged in the X direction on the X-Y plane, while those whose transmission wavelength bandwidths are the same are arranged in the Y direction.

As illustrated in FIG. 6, when the transmission wavelength changes in the one-dimensional direction (X direction), the light intensity I obtained has a relationship such that, with the detection coordinates of the infrared detection device layer 8, which is a two-dimensional infrared detection sensor, being set to (x, y), the intensity thereof is represented as I (x=$\lambda_i$, y), and x corresponds to the wavelength $\lambda_i$.

Next, an exemplary method of manufacturing the imaging module 6, which is a major part of the solid imaging apparatus 1 according to the present embodiment, is described.

First, as illustrated in FIGS. 2 and 3, in the pixel region (imaging region) on the one face side of the semiconductor substrate 19, the optical detector 10, the wiring 20, and a wiring of the support leg 21 are formed. On the other hand, in the peripheral circuit region, there are formed, at the same time, the read circuit 11, the wiring layer 12, the through electrode 13, and the electrode pad 14. Then, the support leg 21 is formed with a trench process technique and a lower portion of the optical detector 10 is etched with an anisotropic etching technique, etc., to separate the etched result from the semiconductor substrate 19, and form the cavity section 18 to be a vacuum. In this way, the infrared detection device layer 8 is formed.

Next, bonding of the support layer (support substrate) 9 and the infrared detection device layer 8 is performed in a high vacuum and the cavity section 18 of the infrared detection device layer 8 is made to be a high vacuum. In this way, dispersion of heat into the support substrate 16 and the semiconductor substrate 19 is suppressed and the sensitivity to the infrared light of the optical detector (infrared detector) 10 is increased.

Next, as illustrated in FIG. 3, a coating of a low-reflection material is formed and film thicknesses in the pixel region (1), the pixel region (2), and the peripheral circuit region are adjusted by etching, etc., to form the transmission layer 25 on the other side of the semiconductor substrate 19. Next, a coating of a high-reflection material is formed on a surface of the transmission layer 25 and the thicknesses are similarly adjusted to form the sympathetic vibration layer 24. In other words, the interference layer 23 which is made up of the transmission layer 25 and the sympathetic vibration layer 24 is formed.

Next, a metal coating is formed on a surface of the interference layer 23, and, collectively, the metal pattern layer 22A having the pattern period ($Γ_A$) and the inter-pattern interval ($s_A$) is formed in the pixel region (1), the metal pattern layer 22B having the pattern period ($Γ_B$) and the inter-pattern interval ($s_B$) is formed in the pixel region (2), and the light shielding layer 15 is formed for the reference pixel. In this way, the wavelength transmission filter array layer 7 which is made up of the interference layer 23 and the metal pattern layer 22 is formed. In other words, the wavelength transmission filter 5 is laminated on the semiconductor substrate 19 which makes up the infrared detection device 4 to integrate the laminated results.

The imaging module 6 may be manufactured in the above-described manner.

Next, an example of a method of using the solid imaging apparatus 1 according to the present embodiment, or, in other words, a method of material identification of a subject and a method of obtaining two-dimensional image information are described.

Figure 7:
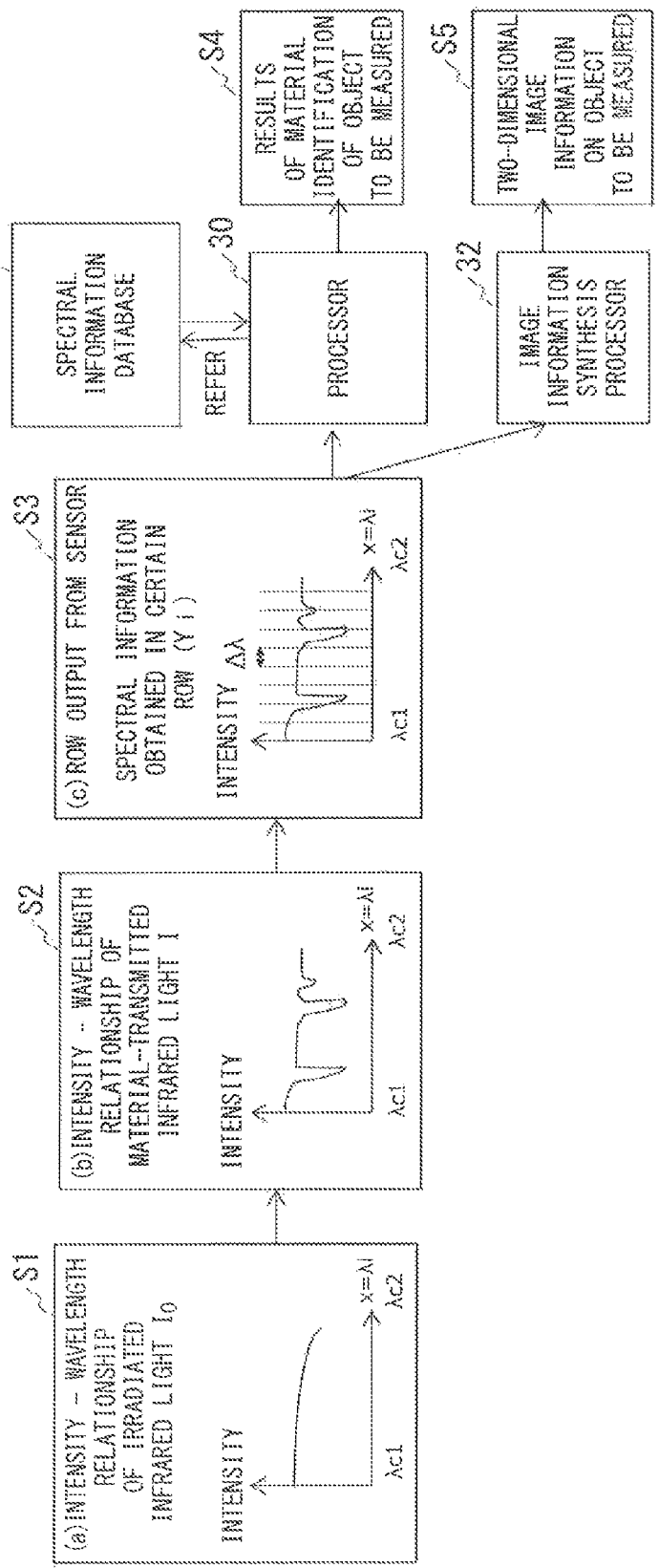
FIG. 7 is a schematic view illustrating a method of material identification of a subject and a method of obtaining two-dimensional image information using the solid imaging apparatus according to the first embodiment.

FIG. 7 is a schematic view illustrating the method of material identification of the subject and the method of obtaining the two-dimensional image information using the solid imaging apparatus 1.

As illustrated in FIG. 1, first an infrared light $I_o$ is irradiated from a thermal type (non-dispersion type) light source 2. Here, step S1 shown in FIG. 7 shows a relationship between the intensity and the wavelength of the infrared light $I_o$ irradiated from the light source 2.

Next, as illustrated in FIG. 1, the infrared light $I_o$ irradiated from the light source 2 transmits the object to be measured (subject) S. Here, step S2 shown in FIG. 7 shows a relationship between the intensity and the wavelength of the infrared light I which transmitted the object to be measured S. As shown in step S2, in a wavelength band (Δλ)

in which absorption occurred in the object to be measured, the light intensity of the transmitted spectrum decreases in accordance with the absorption characteristics of the object to be measured.

Next, as illustrated in FIG. 1, with the infrared light I which transmitted the object to be measured S being collected with the lens 3 and the coordinates of a sensor face onto which the light intensity at the respective spatial positions (X, Y, Z) is projected as an image being set as (x,y), the intensity decrease is sampled in the imaging module 6 with the image light intensity being set as I (x,y). Here, step S3 shown in FIG. 7 shows spectral information (wavelength information) obtained in a certain row (Yi) of the imaging module 6.

The solid imaging apparatus 1 according to the present embodiment makes it possible, from wavelength information obtained by the imaging module (infrared detection device) 6, to discriminate a material of the object to be measured (subject) S to identify the discriminated results and obtain image information on the subject S. The method of material identification and the method of image synthesis are separately described below.

First, an exemplary method is described of discriminating the material from the absorption characteristics in the infrared region of molecules and the material.

Various functional groups have specific absorption intensities and absorption energies (wave numbers). As a trend for the relationship between the absorption wavelength (frequency) and the structure, first, absorption appears at the high number of vibrations (on the short wavelength side) when a constituent atom is light; with a stretching vibration due to a single bond with hydrogen, such as a C—H bond, an O—H bond, an N—H bond, hydrogen is light, so that absorption appears at the high number of vibrations (short wavelength). Thus, conversely, when the mass of the constituent atom increases, absorption appears on the low frequency (long wavelength) side.

When a bond of two atoms is strong, absorption also appears at the high number of vibrations (on the short wavelength side). For example, with a triple bond, absorption appears at a frequency which is higher than that with a double bond or a single bond; while absorption appears at the wave number 2200 cm$^{-1}$ ($\lambda$=4.55 μm) with the triple bond (C≡C), it appears at the wave number 1640 cm$^{-1}$ ($\lambda$=6.1 μm) with the double bond (C═C) and at the wave number 1000 cm$^{-1}$ ($\lambda$=10 μm) with the single bond (C—C).

Numerous gases (gas molecules) are also present which exhibit absorption in infrared. For example, alcohols (methanol, ethanol, etc.) and $CO_2$, CO, $NO_X$, $SO_2$, etc., are representative gas molecules which exhibit strong absorption in the infrared region. On the other hand, molecules having a center of symmetry ($H_2$, $O_2$, $N_2$, etc.) do not exhibit infrared absorption. This is because the infrared absorption is caused by the dipole moment changing due to molecular vibrations and the changed dipole moment interacting with the electric vector of the light.

To obtain these molecular absorption spectra information sets, an infrared light is irradiated from a continuous light source for measurement; the intensity thereof is decreased in a wavelength band in which a sample exhibits absorption, so that the decrease in the intensity is measured in the whole wave number (wavelength) region. A filter which only passes a transmission width $\Delta\lambda$ may be used to detect it for the respective wavelength band ($\Delta\lambda$).

As shown in FIG. 7, the obtained spectra are sent to a processor 30. In the processor 30, the spectral information is checked against a spectral information database 31 and the similarities of the intensity and the position of the absorption band are compared to perform compound identification. Then, as shown in step S4 in FIG. 7, results of material identification of the object to be measured S is obtained from the processor 30.

Next, an exemplary method of spectral image synthesis is described.

To obtain complete spectral information $\Gamma$ (x, y, $\lambda$) on the image coordinates (x, y) onto which the subject S is projected, the solid image apparatus 1 or the subject S is swept in the X direction to perform continuous shooting. For synthesis and connection, HS (Hyperspectral) images themselves may be synthesized, or, with a visible camera being embedded into a camera apparatus, the HS images may be synthesized based on a visible viewpoint. The method of synthesis and connection of one-dimensional filters has become a common function which is provided in a camera, such as in a mobile telephone, with the progress in the image processing and synthesis techniques in recent years and is called the pushbroom technique. This technique is arranged to not significantly impair spatial resolution even when the number of spectral bands is substantially large.

Here, the spectral information (wavelength information) from the imaging module 6 that is obtained by sweeping the solid image apparatus 1 or the subject S in the X direction to perform continuous shooting is sent to an image information synthesis processor 32 as shown in FIG. 7. In the image information synthesis processor 32, image information synthesis processing is performed. Then, as shown in step S5 in FIG. 7, two-dimensional image information on the object to be measured S is obtained from the image information synthesis processor 32.

The processor 30, the spectral information database 31, and the image information synthesis processor 32 that are shown in FIG. 7 may be included in the solid imaging apparatus 1, or may be included in equipment into which the solid imaging apparatus 1 is embedded. Moreover, the spectral information database 31 and the image information synthesis processor 32 may be provided externally, and, via a wired or wireless communications device, spectral information may be transmitted from the solid imaging apparatus 1 and results of material identification or two-dimensional image information may be received.

The solid imaging apparatus 1 according to the first embodiment is used for imaging apparatuses such as those in various mobile terminals such as digital cameras, mobile telephones (including smartphones), and monitoring cameras, web cameras using the Internet.

Figure 8:
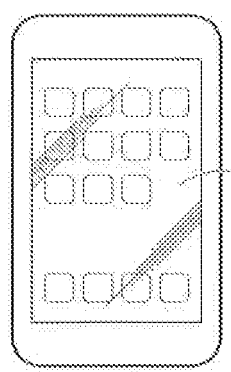
FIG. 8 is a plan view illustrating a smartphone in which the solid image apparatus is embedded.

FIG. 8 is a plan view illustrating a smartphone 61 including a camera in which the solid imaging apparatus 1 according to the present embodiment is provided. The smartphone 61 includes a camera (not shown) and a touch panel 62. When the camera is provided in the upper portion of the front face of the smartphone 61, for example, the front face of the smartphone 61 may be shot. Moreover, the touch panel 62, which is provided at the center of the front face of the smartphone, makes it possible to display thereon an image shot with the camera.

Figure 9:
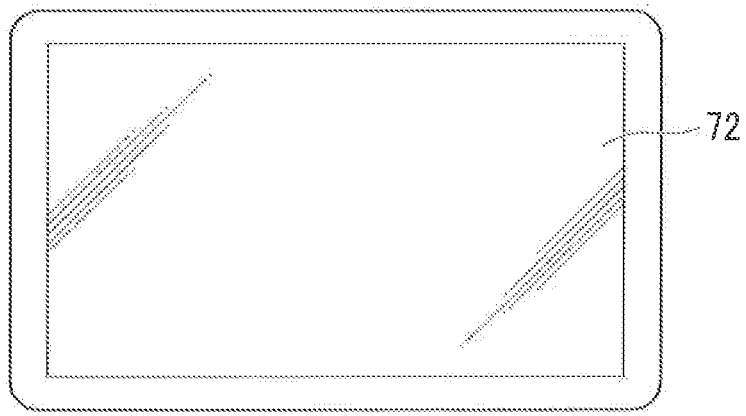
FIG. 9 is a plan view illustrating a tablet terminal in which the solid image apparatus is embedded.

FIG. 9 is a plan view illustrating a tablet 71 including a camera in which the solid image apparatus 1 according to the present embodiment is provided. The tablet 71 includes a camera (not shown) and a touch panel 72. When the camera is provided in the upper portion of the front face of the tablet 71, for example, the front face of the tablet 71 may be shot.

Moreover, the touch panel 72, which is provided at the center of the front face of the tablet, makes it possible to display thereon an image shot with the camera.

Figure 10:
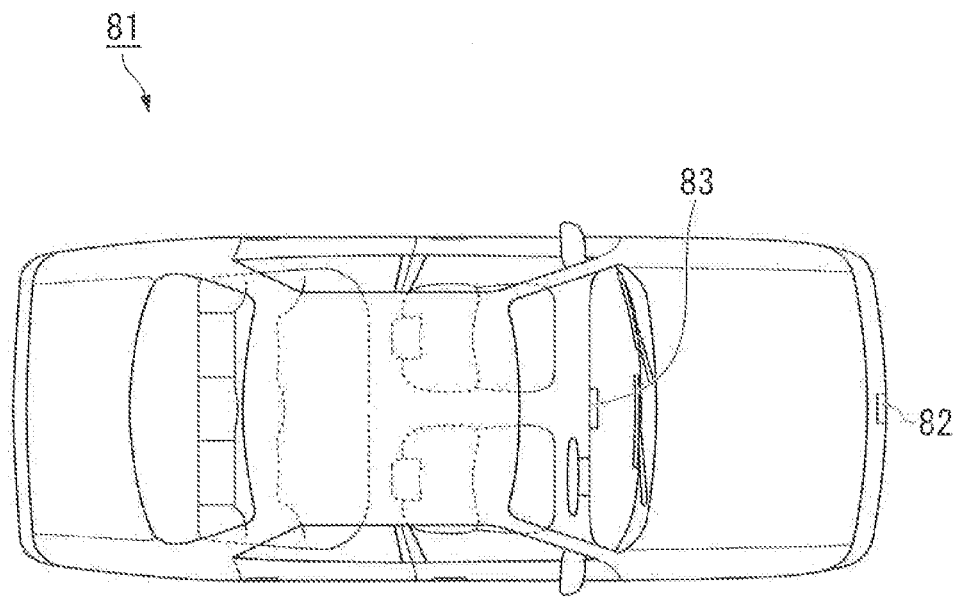
FIG. 10 is a plan view illustrating one example of an automobile in which are provided the solid imaging apparatus and an image display apparatus.

FIG. 10 is a perspective view illustrating one example of an automobile 81 including a camera 82 in which is provided the solid imaging apparatus 1 according to the present embodiment. The automobile 81 includes the camera 82 and a display 83. The camera 82, which is provided in the front end of the automobile 81, makes it possible to shoot the front of the automobile 81. Moreover, the display 83, which is provided in the front face of the driver's seat of the automobile 81, makes it possible to display an image shot with the camera 82. The image shot with the camera 82 may be checked with the display 83 to check the dead angle even in the evening at the time of parking a car, for example.

Figure 11:
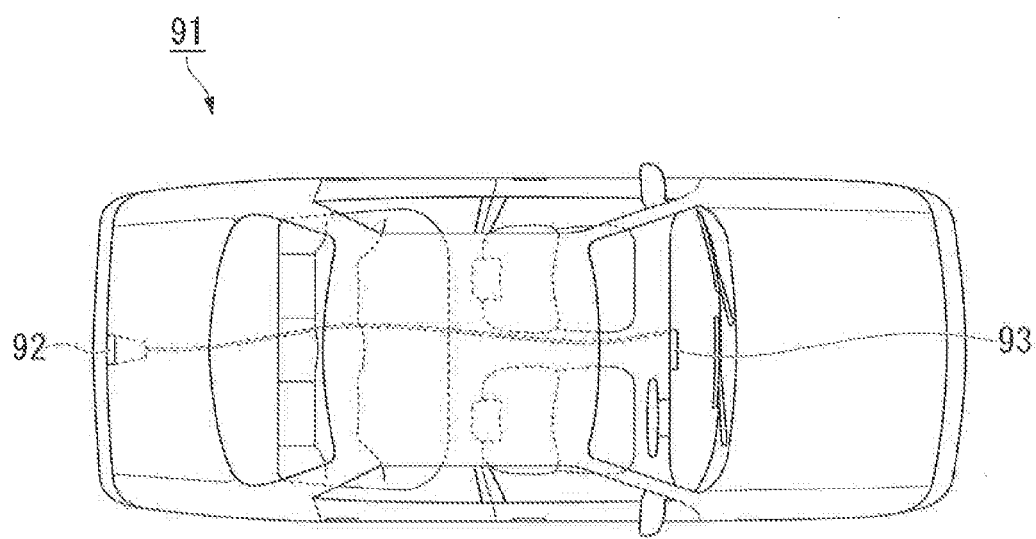
FIG. 11 is a plan view illustrating another example of the automobile in which are provided the solid imaging apparatus and the image display apparatus.

FIG. 11 is a perspective view illustrating one example of an automobile 91 including a camera 92 in which is provided the solid imaging apparatus 1 according to the present embodiment. The automobile 91 includes the camera 92 and a display 93. The camera 92, which is provided in the rear end of the automobile 91, makes it possible to shoot the rear of the automobile 91. Moreover, the display 93, which is provided in the front face of the driver's seat of the automobile 91, makes it possible to display an image shot with the camera 92. The image shot with the camera 92 may be checked with the display 93 to check the rear even in the evening.

As described above, the solid imaging apparatus 1 according to the present embodiment is a solid imaging apparatus including the light source 2 which irradiates an infrared light $I_o$ onto a subject S; the lens (an image-forming optical member) 3; the infrared detection device 4 in which multiple pixels which are sensitive in wavelength bands to be detected are arranged in a two-dimensional array on an X-Y plane; and the wavelength transmission filter array 5 in which multiple wavelength transmission filters having different transmission wavelength bandwidths of transmission wavelength bands are arranged on the X-Y plane, wherein the imaging module 6 is configured such that the infrared detection device (infrared detection device layer) 4 and the wavelength transmission filter array (wavelength transmission filter array layer) 5 are integrated therein, so that it is superior in material discrimination performance and allows obtaining image information.

In the solid imaging apparatus 1 according to the present embodiment, the wavelength transmission filter array 5 in which are arranged wavelength transmission filters which respectively transmit specific wavelengths is formed immediately above multiple infrared detection pixels, so that the precision of alignment between the wavelength transmission filter and the pixel is improved. Therefore, reduction in the size of the equipment is made possible.

In the solid imaging apparatus 1 according to the present embodiment, the wavelength transmission filter array layer 7 is arranged to include the resonance layer 22 and the interference layer 23. Therefore, film thickness of the interference layer 23 and the size of the metal pattern in the resonance layer 22 are changed to facilitate changing the transmission wavelength of individual filters.

The resonance layer 22 which makes up the wavelength transmission filter array layer 7 makes it to possible to achieve a narrow transmission wavelength bandwidth performance. In this way, a molecule-specific absorption peak in a close wavelength band may be separated to further improve the material discrimination performance.

The solid imaging apparatus 1 according to the present embodiment may be applied to an infrared hyperspectral technique in which sampling is made for each wavelength bandwidth. This makes it possible to obtain advantages that it is not likely to affect the subject to be measured or the environment. Moreover, measuring the absorbance of light allows high speed measurement, making it possible to conduct simultaneous measurement of multiple subjects. Furthermore, simultaneous measurement of multiple subjects can be conducted at multiple wavelengths to make it possible application to fields such as warming gas measurement (refrigerant gas measurement), exhaust gas measurement, indoor air monitoring, breath alcohol analysis, noninvasive blood measurement, etc.

The solid imaging apparatus 1 according to the present embodiment allows obtaining information on the above-mentioned fields with imaging (image information), resulting in a dramatic increase in the amount of information obtained. This makes it possible to simultaneously detect a large number of individuals, so that there is applicability also as an apparatus for screening, such as detecting an intoxicated individual within a crowd.

The configuration of the solid imaging apparatus 1 according to the present embodiment is merely exemplary.

While the configuration according to the first embodiment is described as the one example in which the infrared light $I_o$ is irradiated onto the subject S from the light source 2, and an image of the infrared light I which transmits the subject S is formed with the lens 3 to detect the formed image with the imaging module 6, or, in other words, the infrared detection device 4, there is also applicability to a configuration in which an image of the infrared light which is reflected from the subject S is formed with the lens 3 to detect the formed image with the imaging module 6. It may be applied to such a configuration to achieve advantages similar to those for the solid imaging apparatus 1 according to the first embodiment.

While the configuration according to the first embodiment is described as the one example in which, in the wavelength transmission filter array 5, wavelength transmission filters in which transmission wavelength bandwidths continuously change are arranged in the X direction (one direction) on the X-Y plane and wavelength transmission filters in which transmission wavelength bandwidths are the same are arranged in the Y direction (the other direction), it is not limited thereto. The configuration may be such that the wavelength transmission filters in which the transmission wavelength bandwidths continuously change are arranged in the Y direction on the X-Y plane and the wavelength transmission filters in which the transmission wavelength bandwidths are the same are arranged in the X direction. In this case, the direction in which the solid imaging apparatus or the subject is swept is the Y direction.

Figure 12:
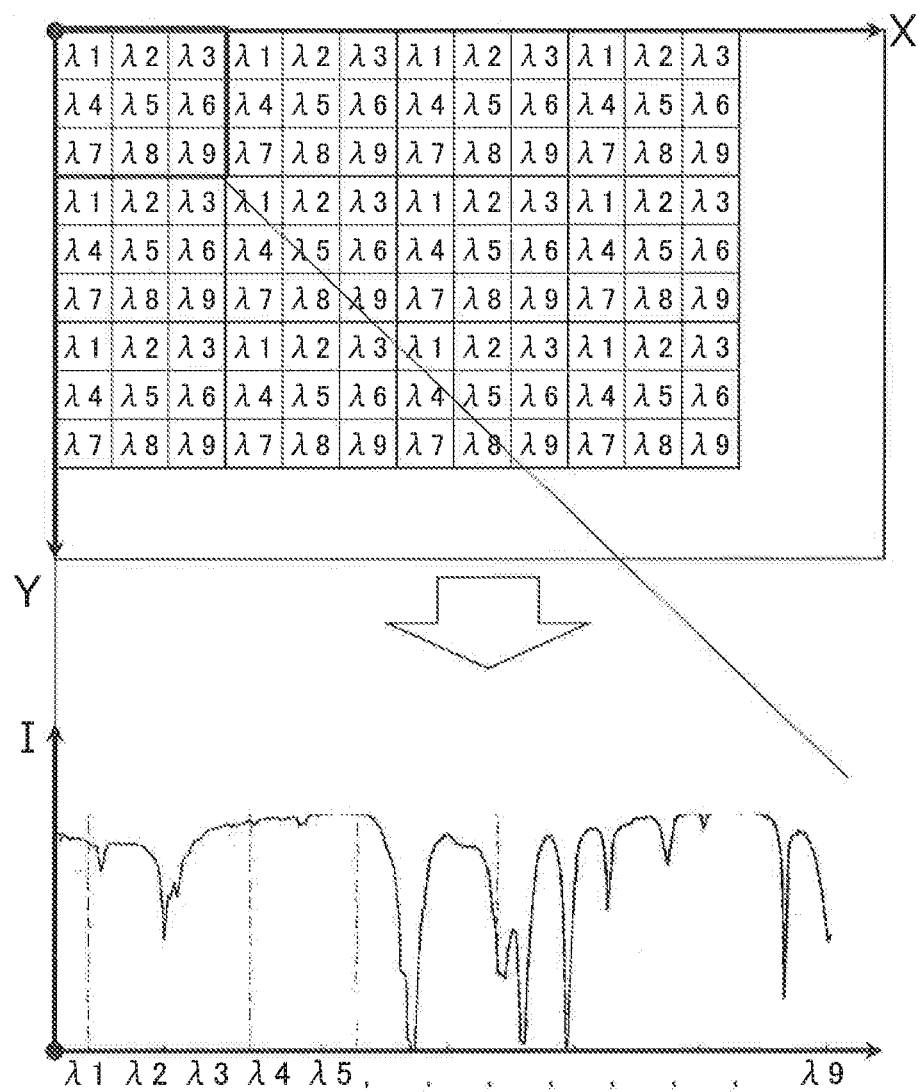
FIG. 12 is a schematic view illustrating the correspondence between a two-dimensional arrangement diagram of a group in which multiple filters of different transmission wavelength bands are combined as one set and spectral data.

The wavelength transmission filter array may be configured such that, groups with a combination of multiple wavelength transmission filters having different transmission wavelength bandwidths as one set are arranged in a two-dimensional array shape on the X-Y plane. Like a Bayer filter (configured with four sheets of B, G1, G2, and R as one set) which is generally used for a visible sensor, the wavelength transmission filter array may be configured such that n sheets of different wavelength bandwidths as one set are two-dimensionally arranged in a mosaic (matrix) shape. Here, FIG. 12 shows, as one example, the correspondence between a two-dimensional arrangement diagram of a group in which nine filters of different transmission wavelength bands are combined as one set and spectral data.

While a case of a two-dimensionally arranged rectangular (generally square) shape is described as one example as shown in FIG. 4 as a metal pattern layer of a metal thin film which makes up the resonance layer 22 according to the first embodiment, it is not limited thereto. Here, FIGS. 13A to 13D are a set of plan views (X-Y plane views) that illustrates different exemplary patterns of the resonance layer.

As shown in FIGS. 13A to 13D, pattern shapes for the metal pattern layer include a regular circle (circle type), a hexagon, a rectangle, a double circle, for example. Moreover, the periodic structure of the metal pattern layer may be in the two-dimensional direction or in the one-dimensional direction. Furthermore, the periodic arrangement of the metal pattern layer includes a square arrangement, a hexagonal arrangement, etc. As described above, the pattern period ($\Gamma$) determines the transmission center wavelength $\lambda_i$ and the inter-pattern interval (s) affects the half-value width, etc., of the transmission wavelength and the transmittance.

Second Embodiment

FIG. 14 is an enlarged cross-sectional view (X-Z plane view) illustrating an exemplary configuration of the imaging module in the solid imaging apparatus according to a second embodiment.

As illustrated in FIG. 14, an imaging module 206 which makes up the solid imaging apparatus according to the second embodiment has a common configuration with that of the imaging module 6 of the first embodiment in that the resonance layer (metal pattern layer) 22 which makes up a wavelength transmission filter array layer 207 has a pattern period ($\Gamma$) and an inter-pattern interval (s) that are different depending on the pixel region and has a configuration which is different therefrom in that a sympathetic vibration layer 224 and a transmission layer 225 which make up an interference layer 223 of a wavelength transmission filter array layer 207 have uniform film thicknesses regardless of the pixel region. Therefore, the same letters will be given to and explanations will be omitted for the configuration which is common to that for the imaging module 6 in the solid imaging apparatus 1 according to the first embodiment.

As illustrated in FIG. 14, in either one of the pixel region (1) and the pixel region (2), the interference layer 223 includes the sympathetic vibration layer 224 of a film thickness $d_2$ and the transmission layer 225 of a film thickness $d_1$.

Here, for the respective transmission filters, the transmission center wavelength $\lambda_i$ is determined by the pattern period ($\Gamma$) of the metal pattern layer. According to the imaging module 206 according to the present embodiment, the configuration of the resonance layer (metal pattern layer) 22 which makes up the wavelength transmission filter array layer 207 is common to that of the imaging module 6 of the first embodiment, so that, even when the film thickness configuration of the interference layer 223 differs, a wavelength transmission filter array is obtained with the transmission wavelength $\lambda_a$ in the pixel region (1) and the transmission wavelength $\lambda_b$ in the pixel region (2).

On the other hand, when the transmission wavelength changes to $\lambda_{c1}$ to $\lambda_{c2}$, for the transmission filter array, it is preferable to set the film thicknesses $d_1$ and $d_2$ of the sympathetic vibration layer 224 and the transmission layer 225 to the center wavelength thereof ($\lambda_i'=(\lambda_{c1}+\lambda_{c2})/2$) or a value which is close thereto.

The solid imaging apparatus according to the second embodiment includes, in the same manner as the solid imaging apparatus according to the first embodiment, an imaging module 206 including a wavelength transmission filter array layer 207 in which multiple wavelength transmission filters with different transmission wavelength bandwidths are arranged on an X-Y plane, so that a material of an object to be measured can be discriminated to identify the discriminated results from wavelength information obtained by the imaging module 206 and image information thereof may be obtained.

According to the second embodiment, the film thicknesses of the sympathetic vibration layer and the transmission layer are not changed in correspondence with the pattern of the metal layer, making it possible to facilitate laminating the wavelength transmission filter array layer 207 on the semiconductor substrate 19.

Third Embodiment

Figure 15:
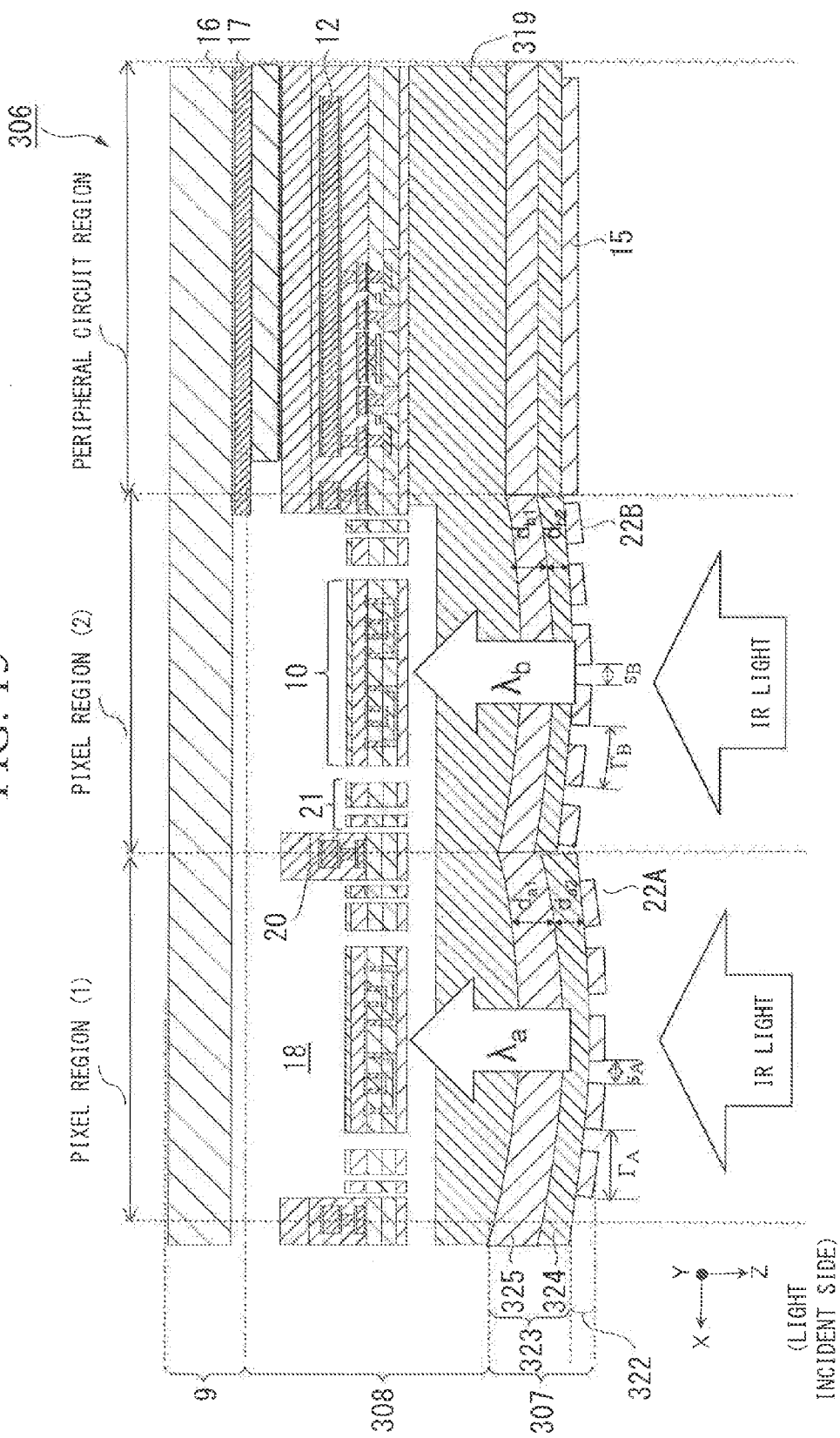
FIG. 15 is an enlarged cross-sectional view illustrating the configuration of the major part of the imaging module according to a third embodiment.

FIG. 15 is an enlarged cross-sectional view (an X-Z plane view) illustrating one example of the configuration of the imaging module in the solid imaging apparatus according to a third embodiment.

As illustrated in FIG. 15, an imaging module 306 which makes up the solid imaging apparatus according to the third embodiment has a common configuration with that of the imaging module 6 of the first embodiment in that a resonance layer (metal pattern layer) 322 which makes up a wavelength transmission filter array layer 307 has a pattern period ($\Gamma$) and an inter-pattern interval (s) that are different depending on the pixel region and in that a sympathetic vibration layer 324 and a transmission layer 325 which make up an interference layer 323 have respectively different film thicknesses depending on the pixel region, and has a configuration which is different therefrom in that a semiconductor substrate 319 which makes up an infrared detection device layer 308 is formed in a lens shape and a wavelength transmission filter array layer 307 is laminated thereon such that it follows the shape thereof. Therefore, the same letters will be given to and explanations will be omitted for the configuration which is common to that for the imaging module 6 in the solid imaging apparatus 1 according to the first embodiment.

Here, for the respective transmission filters, the transmission center wavelength $\lambda_i$ is determined by the pattern period ($\Gamma$) of the metal pattern layer. According to the imaging module 306 according to the present embodiment, the configuration of the resonance layer (metal pattern layer) 322 which makes up the wavelength transmission filter array layer 307 is common to that of the imaging module 6 of the first embodiment, so that a wavelength transmission filter array is obtained with the transmission wavelength $\lambda_a$ in the pixel region (1) and the transmission wavelength $\lambda_b$ in the pixel region (2).

For the sympathetic vibration layer 324, in a manner similar to the first embodiment, to prevent reflection of the transmission wavelength $\lambda_i$ and increase the transmittance, with the reflectance of the material thereof being set to $n_{d1}$, the film thickness $d_1$ is set such that $d_1=\lambda_i/4n_{d1}$.

For the transmission layer 325, in a manner similar to the first embodiment, with the reflectance of the material thereof being set to $n_{d2}$, the film thickness is $d_2$ set such that $d_2=\lambda_i/2n_{d2}$. The film thickness of the transmission layer 325 is set to be a ½ wavelength of the optical film thickness to cause sympathetic vibration within the thin film of the transmission layer 325 and increase the transmittance.

According to the solid imaging apparatus of the third embodiment, in a manner similar to that of the solid imaging apparatus of the first embodiment, a material of an object to be measured can be discriminated to identify the discriminated results from wavelength information obtained by the imaging module 306 and image information thereof may be obtained.

The solid imaging apparatus of the third embodiment is configured such that the semiconductor substrate 319 which makes up the imaging module 306 is processed in a lens shape and the wavelength transmission filter array layer 307 is laminated thereon. With such a configuration, the imaging module 306 makes it possible to effectively collect light with the light detector 10 and improve the light detection efficiency.

Fourth Embodiment

Figure 16:
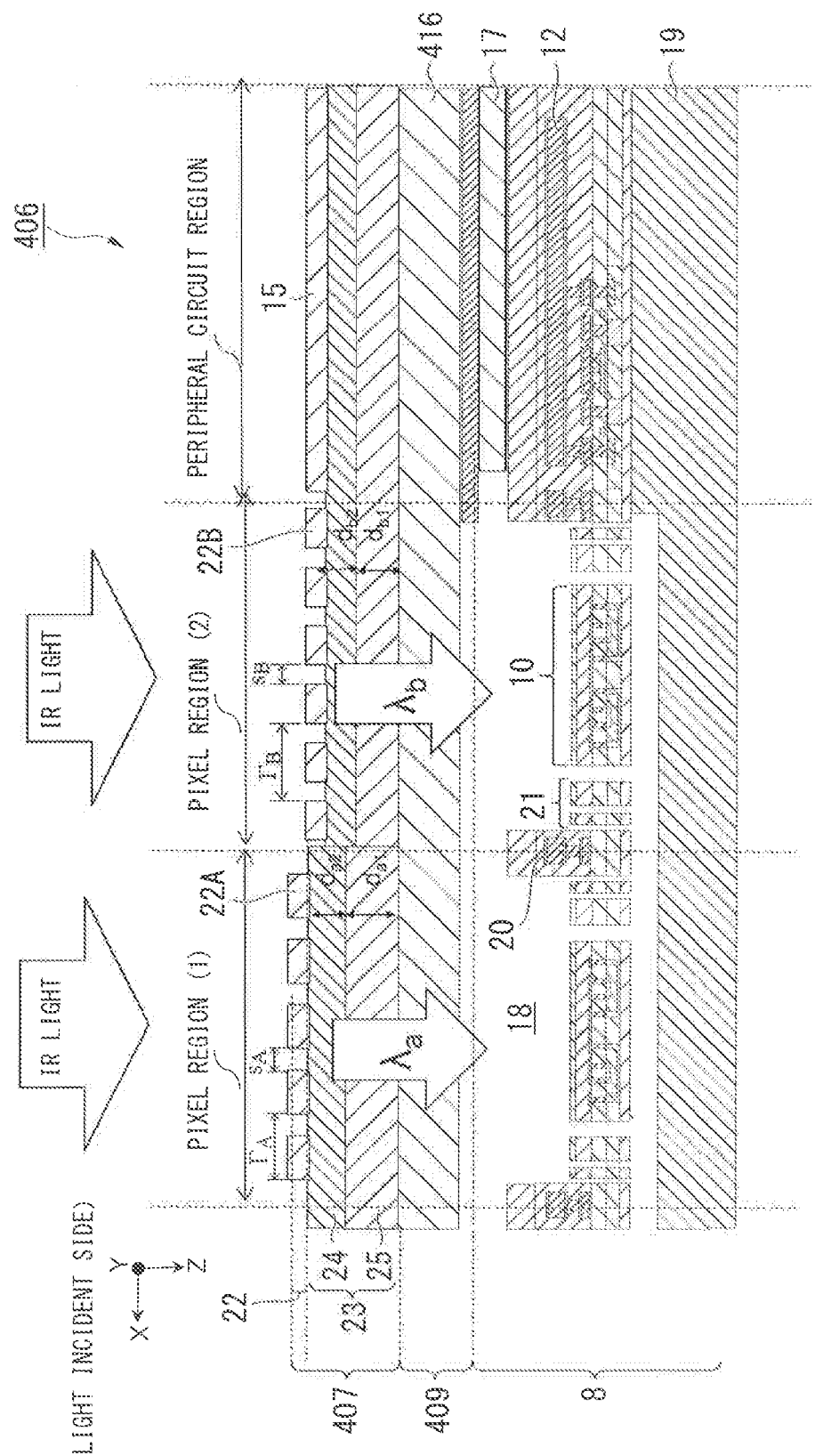
FIG. 16 is an enlarged cross-sectional view illustrating the configuration of the major part of the imaging module according to a fourth embodiment.

FIG. 16 is an enlarged cross-sectional view (an X-Z plane view) illustrating one example of the configuration of the imaging module in the solid imaging apparatus according to a fourth embodiment.

As illustrated in FIG. 16, an imaging module 406 which makes up the solid imaging apparatus according to the fourth embodiment has a common configuration with that of the imaging module 6 of the first embodiment in that the resonance layer (metal pattern layer) 22 which makes up a wavelength transmission filter array layer 407 has a pattern period (Γ) and an inter-pattern interval (s) that are different depending on the pixel region and in that the sympathetic vibration layer 24 and the transmission layer 25 which make up the interference layer 23 have respectively different film thicknesses depending on the pixel region, and has a configuration which is different therefrom in that a wavelength transmission filter array layer 407 is formed on a support layer 409 and infrared light is irradiated from the support substrate 416 side. Therefore, the same letters will be given to and explanations will be omitted for the configuration which is common to that for the imaging module 6 in the solid imaging apparatus 1 according to the first embodiment.

As a material for the support substrate 416 which makes up the support layer 409, it is preferable to use a material with the transmittance in a desired infrared region that is sufficiently high, such as silicon (Si), germanium (Ge), etc., for example. This makes it possible to effectively transmit light to the light detector 10.

Here, for the respective transmission filters, the transmission center wavelength $\lambda_i$ is determined by the pattern period (Γ) of the metal pattern layer. According to the imaging module 406 according to the present embodiment, the configuration of the resonance layer (metal pattern layer) 22 which makes up the wavelength transmission filter array layer 407 is common to that of the imaging module 6 of the first embodiment, so that a wavelength transmission filter array is obtained with the transmission wavelength $\lambda_a$ in the pixel region (1) and the transmission wavelength $\lambda_b$ in the pixel region (2).

In a manner similar to the first embodiment, to prevent reflection of the transmission wavelength $\lambda_i$ and increase the transmittance, with the reflectance of the material thereof being set to $n_{d1}$, the film thickness $d_1$ of the sympathetic vibration layer 24 is set such that $d_1 = \lambda_i / 4 n_{d1}$.

In a manner similar to the first embodiment, with the reflectance of the material thereof being set to $n_{d2}$, the film thickness $d_2$ of the transmission layer 25 is set such that the film thickness $d_2 = \lambda_i / 2 n_{d2}$. The film thickness is set to be a ½ wavelength of the optical film thickness to cause sympathetic vibration within the thin film of the transmission layer 25 and increase the transmittance.

When the transmission wavelength changes to $\lambda_{c1}$ to $\lambda_{c2}$, for the transmission filter array, it is preferable to set the film thicknesses $d_1$ and $d_2$ of the sympathetic vibration layer 24 and the transmission layer 25 to the center wavelength thereof ($\lambda_i' = (\lambda_{c1} + \lambda_{c2})/2$) or a value which is close thereto.

According to the solid imaging apparatus of the fourth embodiment, in a manner similar to that of the solid imaging apparatus of the first embodiment, a material of an object to be measured can be discriminated to identify the discriminated results from wavelength information obtained by the imaging module 406 and image information thereof may be obtained.

According to the fourth embodiment, formation of the infrared detection device 4 and formation of the wavelength transmission filter array layer 407 onto the support substrate 416 may be moved forward in parallel to reduce manufacturing time of the imaging module 406.

Fifth Embodiment

Figure 17:
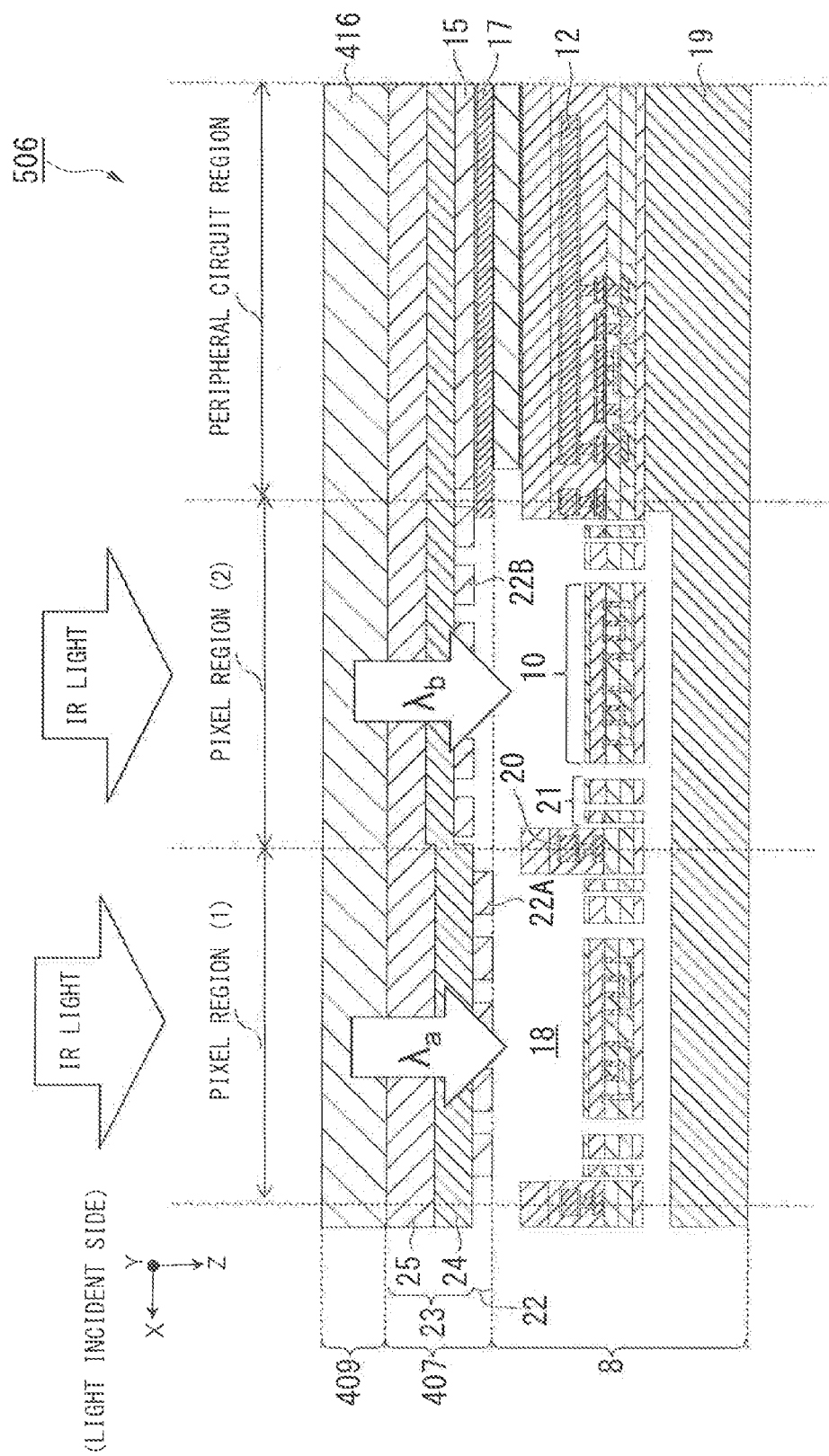
FIG. 17 is an enlarged cross-sectional view illustrating the configuration of the major part of the imaging module according to a fifth embodiment.
Figure 18:
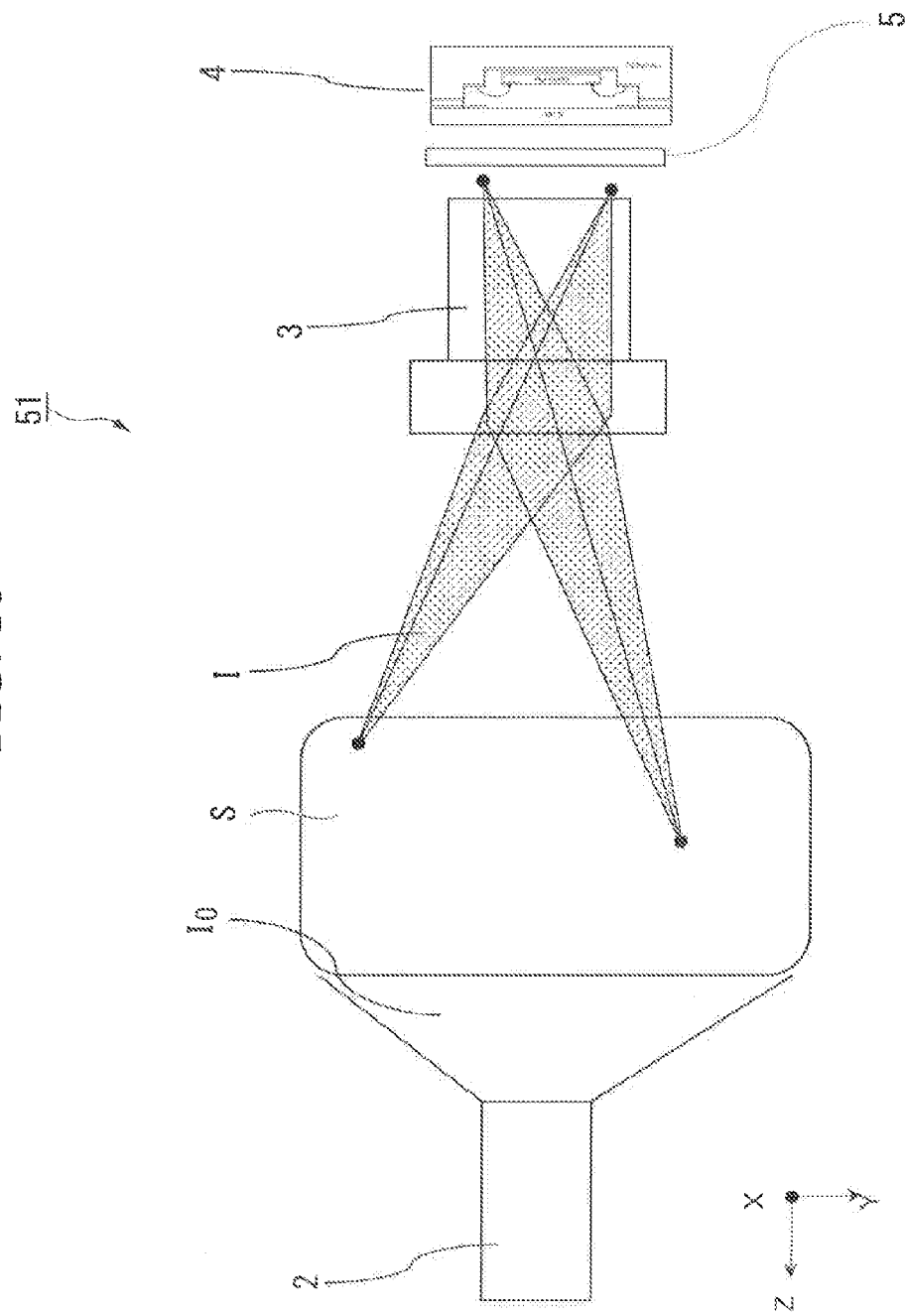
FIG. 18 is a system diagram illustrating a configuration of a variation of the solid imaging apparatus.

FIG. 17 is an enlarged cross-sectional view (X-Z plane view) illustrating one example of the configuration of the imaging module in the solid imaging apparatus according to a fifth embodiment.

As illustrated in FIG. 17, an imaging module 506 which makes up the solid imaging apparatus according to the fifth embodiment has a common configuration with that of the imaging module 406 of the fourth embodiment in that a wavelength transmission filter array layer 407 is formed on a support layer 409 and infrared light is irradiated from the support substrate 416 side, and has a configuration which is different therefrom in that a support layer 409 and the infrared detection device layer 8 are laminated such that the resonance layer (metal pattern layer) 22 which makes up the wavelength transmission filter array layer 407 is located on the infrared detection device layer 8 side. Therefore, the same letters will be given to and explanations will be omitted for the configuration which is common to that for the imaging modules 6 and 406 according to the first and fourth embodiments.

According to the solid imaging apparatus of the fifth embodiment, in a manner similar to that of the solid imaging apparatus of the first embodiment, a material of an object to be measured can be discriminated to identify the discriminated results from wavelength information obtained by the imaging module 506 and image information thereof may be obtained.

According to the fifth embodiment, in a manner similar to the solid imaging apparatus of the fourth embodiment, formation of the infrared detection device 4 and formation of the wavelength transmission filter array layer 407 onto the support substrate 416 may be moved forward in parallel to reduce manufacturing time of the imaging module 506.

According to the fifth embodiment, the wavelength transmission filter array layer 407 may be provided in proximity to the light detector 10. This makes it possible to reduce the amount of mixing in of the transmission wavelengths $\lambda_a$ and $\lambda_b$ 407 that are incident on neighboring cells and increase the wavelength resolution.

The configuration of the solid imaging apparatus according to the first to fifth embodiments is exemplary, so that it is not limited thereto.

While a case of using an imaging module in which the infrared detection device and the wavelength transmission filter array are integrated is described as an example in the first to fifth embodiments, the wavelength transmission filter array 5 may be located in proximity to the infrared detection device 4 between the lens (image forming optical member) 3 and the infrared detection device 4. It is preferable to align the wavelength transmission filter array and the image region of the infrared detection device to bring them into close contact to use them. Such a configuration makes it possible to discriminate a material of an object to be measured S to identify the discriminated results from wavelength information obtained by the infrared detection device 4 and obtain image information thereof.

The solid imaging apparatus according to at least one of the embodiments described above includes the light source 2 which irradiates an infrared light onto an object to be measured (a subject); the lens (image-forming optical member) 3; the infrared detection device 4 in which multiple pixels which are sensitive in the wavelength bands to be detected are arranged in a two-dimensional array on an X-Y plane; and a wavelength transmission filter array 5 in which multiple wavelength transmission filters having different transmission wavelength bandwidths of transmission wavelength bands are arranged on an X-Y plane. The above-described solid imaging apparatus makes it possible to provide a solid imaging apparatus which is superior in the material discrimination performance and from which image information is obtained. Moreover, a material of an object to be measured can be discriminated to identify the discriminated results from wavelength information obtained by the infrared detection device 4 and image information thereof may be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. An imaging device comprising:
   a light source which irradiates an infrared light including one or more wavelengths to a subject;
   a lens which forms an image of the infrared light transmitting the subject or being reflected from the subject;
   an infrared detection device including a plurality of pixels which are sensitive to the wavelength; and
   a filter array which is provided in proximity to the infrared detection device between the lens and the infrared detection device and including a plurality of wavelength filters having different transmission wavelengths,
   wherein the filter array of the plurality of wavelength filters has transmission wavelengths that change continuously in one direction on a plane and that are the same as each other in a different direction which is orthogonal to the one direction.

2. The imaging device as claimed in claim 1, wherein the infrared detection device and the filter array are laminated to be integrated.

3. The imaging device as claimed in claim 1, wherein, in the filter array, one or more groups into which the plurality of wavelength filters having the different transmission wavelengths are combined are arranged in a two-dimensional array.

4. The imaging device as claimed in claim 1, wherein, the filter array has a structure in which a resonance layer and an interference layer are laminated; and
the resonance layer and the interference layer are arranged such that the resonance layer is located on the image-forming optical member side and the interference layer is located on the infrared detection device side.

5. The imaging device as claimed in claim 4, wherein the resonance layer is a metal pattern layer having a periodic structure that is made of a metal thin film.

6. The imaging device as claimed in claim 5, wherein the metal thin film is made of any one metal or an alloy of at least two types of metals of a group consisting of aluminum, silver, gold, tungsten, and copper.

7. The imaging device as claimed in claim 5, wherein, for the wavelength transmission filters, the transmission wavelengths differ depending on a pattern period of the metal pattern layer.

8. The imaging device as claimed in claim 5, further comprising a light shielding layer which is formed with the same metal thin film as that of the metal pattern layer.

9. The imaging device as claimed in claim 4, wherein the interference layer includes a sympathetic vibration layer formed of a high-reflectance material and a transmission layer formed of a low-reflectance material.

10. The imaging device as claimed in claim 9, wherein the high-reflectance material is silicon or germanium.

11. The imaging device as claimed in claim 9, wherein the low-reflectance material is any one of silicon oxide, zinc selenide, and zinc sulfide.

12. The imaging device as claimed in claim 1, wherein the infrared detection device includes a semiconductor substrate; a micro bolometer array which is provided on the semiconductor substrate; and a support substrate, wherein the semiconductor substrate and the support substrate are laminated such that the micro bolometer array is sealed therebetween.

13. The imaging device as claimed in claim 12, wherein the filter array is laminated on the semiconductor substrate side of the infrared detection device.

14. The imaging device as claimed in claim 13, wherein the semiconductor substrate is formed in a lens shape.

15. The imaging device as claimed in claim 12, wherein the filter array is provided on the support substrate.

16. The imaging device as claimed in claim 1, wherein at least two of a light source, an image-forming optical member, an infrared detection device, and the wavelength transmission filter array cause a processor to perform material identification of the subject and cause an image information synthesis processor to obtain image information of the subject to be obtained from wavelength information of the infrared detection device.

17. An imaging device comprising:
   a light source which irradiates an infrared light including one or more wavelengths to a subject;
   a lens which forms an image of the infrared light transmitting the subject or being reflected from the subject;
   an infrared detection device including a plurality of pixels which are sensitive to the wavelength; and
   a filter array which is provided in proximity to the infrared detection device between the lens and the infrared detection device and including a plurality of wavelength filters having different transmission wavelengths,
   wherein the filter array has a structure in which a resonance layer and an interference layer are laminated; and
   wherein the resonance layer and the interference layer are arranged such that the resonance layer is located on the image-forming optical member side and the interference layer is located on the infrared detection device side.

\* \* \* \* \*